United States Patent [19]
Higashi et al.

[11] Patent Number: 5,932,891
[45] Date of Patent: Aug. 3, 1999

[54] SEMICONDUCTOR DEVICE WITH TEST TERMINAL AND IC SOCKET

[75] Inventors: Tatsushi Higashi; Akihiro Kuroda; Hiroaki Tosa, all of Hyogo, Japan

[73] Assignee: Mitsubishi Denki Kabushiki Kaisha, Tokyo, Japan

[21] Appl. No.: 09/030,268

[22] Filed: Feb. 25, 1998

[30] Foreign Application Priority Data

Aug. 28, 1997 [JP] Japan .................................... 9-232338

[51] Int. Cl.⁶ .................................................. H01L 23/58
[52] U.S. Cl. .......................... 257/48; 257/737; 324/755; 361/767; 439/66; 438/18
[58] Field of Search .............................. 257/48, 738, 780, 257/727; 324/755, 758, 761; 361/767, 760; 439/66, 67; 438/18, 111, 118

[56] References Cited

U.S. PATENT DOCUMENTS

| | | | |
|---|---|---|---|
| 4,893,172 | 1/1990 | Matsumoto et al. | 357/79 |
| 5,418,471 | 5/1995 | Kardos | 324/758 |
| 5,646,442 | 7/1997 | Abe et al. | 257/697 |
| 5,844,317 | 12/1998 | Bertolet et la. | 257/773 |

FOREIGN PATENT DOCUMENTS

| | | |
|---|---|---|
| 6-203926 | 7/1994 | Japan . |
| 8-78554 | 3/1996 | Japan . |
| 8-288036 | 11/1996 | Japan . |

*Primary Examiner*—Olik Chaudhuri
*Assistant Examiner*—Douglas A. Wille
*Attorney, Agent, or Firm*—McDermott, Will & Emery

[57] ABSTRACT

A plurality of solder balls are arranged at a main surface of a BGA type semiconductor device. A test terminal is provided on the main surface adjacent to the solder ball. A contact pin of an IC socket is abutted against this test terminal. Accordingly, favorable electrical connection between a contact pin and a protruding external electrode can be achieved while suppressing deformation of the external electrode in testing a semiconductor device prior to mounting.

10 Claims, 7 Drawing Sheets

SEMICONDUCTOR DEVICE WITH TEST TERMINAL AND IC SOCKET

BACKGROUND OF THE INVENTION

1. Field of the Invention

The present invention relates to a structure of a semiconductor device including a plurality of protruding external electrodes such as a solder ball or solder bump arranged on a main surface and a test terminal, and a structure of an IC socket used for testing a semiconductor device.

2. Description of the Background Art

Conventional semiconductor devices such as the BGA (Ball Grid Array) type, CSP (Chip Scale Package) type, and KGD (Known Good Die) type having a plurality of protruding external electrodes arranged on a main surface are known. An example of such a BGA type semiconductor device is shown in FIG. 11. Referring to FIG. 11, a BGA semiconductor device 1 includes a mold resin 2, a LSI chip 3, a wire 4, an adhesive 5, an interconnection layer 6, a substrate 7, an internal conductor 9, and a solder ball 10.

LSI chip 3 is mounted at the backside of substrate 7 and covered with mold resin 2. LSI chip 3 is connected to interconnection layer 6 via wire 4. A through hole 8 is formed in substrate 7. Internal conductor 9 is formed in through hole 8. Solder ball 10 is formed on internal conductor 9.

FIG. 12 is a plan view of the BGA type semiconductor device of FIG. 11. The sectional view taken along line XI—XI of this FIG. 12 is shown in FIG. 11. It is appreciated that solder balls 10 are arranged in a matrix at the main surface of substrate 7, as shown in FIG. 12. In the present specification, the surface where a protruding electrode such as solder ball 10 is arranged is called the main surface of the semiconductor device.

An IC socket as shown in FIG. 13 can be used in testing a BGA type semiconductor device 1 of the above-described structure. This IC socket includes a body 12, an alignment plate 14, a spring 15, and a contact pin 13. Alignment plate 14 is supported by spring 15, and includes a through hole for receiving solder ball 10 and contact pin 13. Contact pin 13 abuts against the bottom of solder ball 10 in the through hole. Testing was carried out by bringing contact pin 13 of the IC socket directly in contact with solder ball 10.

This direct contact between contact pin 13 and the bottom of solder ball 10 sometimes causes deformation of solder ball 10, whereby adjacent balls 10 are short-circuited to each other after mounting.

The surface of a solder ball 10 is formed mainly of a curve as shown in FIG. 13, and has convex and concave portions in many cases. When contact pin 13 is brought directly in contact with such a solder ball 10, contact pin 13 may form contact only with the convex portion at the surface of solder ball 10. In this case, the area of contact between contact pin 13 and solder ball 10 is reduced. There is a problem that appropriate electrical characteristics cannot be obtained during testing.

There is also a possibility that solder scraps may be adhered to the tip of contact pin 13 when direct contact is provided between solder ball 10 and contact pin 13. In this case, contact failure between contact pin 13 and solder ball 10 may occur due to oxidation of the solder scraps attached at the tip of contact pin 13. There is also a possibility of the solder scraps at contact pin 13 being transferred to another solder ball 10 to cause shorting between solder balls 10 after mounting.

SUMMARY OF THE INVENTION

In view of the foregoing, an object of the present invention is to provide a semiconductor device and an IC socket that has deformation of an external electrode such as a solder ball effectively suppressed during testing prior to mounting while achieving favorable electrical connection between a contact pin and an external electrode.

A semiconductor device with a test terminal according to the present invention includes a plurality of protruding external electrodes arranged at a main surface, and an internal conductor connected to the external electrode. The test terminal is provided adjacent to the external electrode on the main surface. The internal conductor and the test terminal is connected via the external electrode.

By providing a test terminal adjacent to an external electrode as described above, the contact pin of an IC socket can be abutted against the test terminal for testing the semiconductor device before mounting. Direct contact between the contact pin and the external electrode such as a solder ball can be avoided to prevent deformation of the external electrode. Also, transfer of a solder scrap to a contact pin can be prevented by forming the test terminal of a material other than solder. Therefore, occurrence of electrical contact failure between a contact pin and an external electrode can be suppressed. Furthermore, a sufficient contact area between a contact pin and a test terminal can be ensured by means such as forming the surface of the test terminal in a planar manner. Since the internal conductor is connected to the test terminal via an external electrode, a defect can be reliably identified when an external electrode is missing.

The above test terminal is preferably arranged spaced apart from the internal conductor. The external electrode preferably extends on the internal conductor and the side of the test terminal.

The above arrangement allows connection between the internal conductor and the test terminal via the external electrode.

Also preferably, the test terminal is arranged at the center area of a region surrounded by three or more external electrodes which are adjacent but not in contact with each other.

The above-described arrangement of the test terminal allows the distance between an ambient external electrode and a test terminal to be maximum. It is therefore possible to effectively prevent shorting between a test terminal and an ambient external electrode. It is also possible to effectively suppress contact between a contact pin and an ambient external electrode when the contact pin of the IC socket is abutted against the test terminal.

The above test terminal can be formed so as to surround the external electrode. This allows abutment between the circumferential side face of the external electrode and the contact pin in abutting the contact pin of the IC socket against the external terminal,. In this case, caution is exercised to avoid contact between the contact pin and the bottom of the external electrode so as to suppress deformation of the external electrode. Thus, not only the test terminal, but also the circumferential side face of the external electrode can be made to abut against the contact pin to increase the area of contact of the contact pin. As a result, favorable electrical contact can be achieved. In the present specification, "the bottom of an external electrode" is defined to refer to the surface area of an external electrode located opposite the side where the main surface is located.

According to an aspect of the present invention, an IC socket is oriented to test a semiconductor device with a test terminal having a plurality of protruding external electrodes arranged at a main surface. The IC socket includes a contact pin, and an alignment mechanism. The contact pin is abutted against a test terminal for testing. The alignment mechanism serves to provide alignment between the contact pin and the test terminal using the circumferential side face of an external electrode.

The alignment mechanism in the IC socket of the present invention allows positioning between a contact pin and a test terminal using the circumferential side face of an external electrode. Positioning between a contact pin and a test terminal can be effected without damaging the bottom of an external electrode (for example, the lower surface region of solder ball 10 shown in FIG. 1). Since alignment is carried out using the circumferential side face of the external electrode, deformation of the external electrode in positioning can be suppressed to a negligible level. The test prior to mounting is carried out by abutting a contact pin against a test terminal after positioning between the contact pin and the test terminal.

The alignment mechanism can include an alignment member attached to the main body of the IC socket. The alignment member preferably includes a concave portion for receiving an external electrode, and a through hole formed apart from the concave portion for receiving a contact pin. By inserting a contact pin into the through hole with the external electrode in the concave portion, the contact pin can be abutted against the test terminal while avoiding contact between the contact pin and the external electrode.

By the above alignment member, the contact pin can be abutted against the test terminal through the through hole in a state where the external electrode is accommodated in the concave portion provided at the alignment member. Accordingly, positioning between the contact pin and the test terminal can be carried out using the circumferential side face of the external electrode. Since the concave portion and the through hole are formed spaced apart, contact between the contact pin and the external electrode can be avoided by a portion of the alignment member located between the concave portion and the through hole. Therefore, deformation and damage of the external electrode by the contact pin when the contact pin is abutted against the test terminal can be prevented. Furthermore, the through hole functions as a guide in abutting the contact pin against the test terminal. Therefore, a desired plane of the tip of the contact pin can be reliably abutted against the test terminal.

The above alignment mechanism can include a concave portion provided at the leading end of a contact pin for receiving an external electrode. In this case, the leading end of the contact pin is abutted against the test terminal with the external electrode accommodated in the concave portion.

Positioning between a contact pin and a test terminal can be carried out using the circumferential side face of the external electrode even in the above case where a concave portion for receiving an external electrode is provided at the leading end of the contact pin. Since abutment between a contact pin and a test pin is provided in a state where the external electrode is received in the concave portion at the leading end of the contact pin, the inner circumferential face of the concave portion can be made to abut against the circumferential side face of the external electrode. Thus, electrical contact can be achieved properly.

The above concave portion preferably has a bottom that is located apart from the bottom of the external electrode accommodated in the concave portion.

It is therefore possible to prevent contact between the bottom of the concave portion and the bottom of the external electrode in effecting abutment between the contact pin and the test terminal. As a result, damage and deformation of the bottom of the external electrode can be avoided when abutment between the contact pin and the test terminal is established.

According to another aspect of the present invention, an IC socket is oriented to test a semiconductor device including a plurality of protruding external electrodes arranged at a main surface. The IC socket of the present aspect includes a contact pin and a net wire. The contact pin includes a concave portion at the leading end thereof. The contact pin is electrically connected to an external electrode for testing. The net wire is attached to the leading end portion of the contact pin defining the concave portion. The net wire is abutted against the circumferential side face of the external electrode excluding the bottom. The net wire has an upper opening for receiving an external electrode. The upper end of the net wire defining the upper opening is connected to the leading end of the contact pin over the entire circumference.

By attaching the above net wire to the leading end of the contact pin, electrical connection between an external electrode and a contact pin can be established via the net wire. Since this net wire is abutted against the circumferential side face of the external electrode excluding the bottom area, the bottom of the external electrode is prevented from being damaged. It is also possible to suppress deformation of the external electrode even if the net wire is abutted against the external electrode since the net wire is generally elastic. Furthermore, since there is a gap between the wires forming the net wire, and the net wire can be deformed according to the surface configuration of the external electrode, an area of contact between an external electrode and a net wire can be ensured even if the surface of the external electrode is slightly convex and concave. The gap-between the wire lines forming the net wire allows solder scraps and the like to fall down through the gaps. Therefore, adherence of solder scraps to the net wire can be prevented.

The above net wire preferably includes a lower opening extending within the concave portion to avoid contact between the bottom of an external electrode and the net wire when the bottom of the external electrode is accommodated. The upper opening has a width greater than that of the lower opening.

By providing a lower opening in the net wire, the bottom of an external electrode can be received in the lower opening. Therefore, contact between the net wire and the bottom of the external electrode can be avoided. Since the upper opening has a width greater than the lower opening, the net wire has a configuration that widens upwards. It is therefore possible to admit the external electrode within the net wire relatively easily even when there is a slight offset in the position between a contact pin and an external electrode.

The foregoing and other objects, features, aspects and advantages of the present invention will become e apparent from the following detailed description of the present invention when taken in conjunction with the accompanying drawings.

DESCRIPTION OF THE PREFERRED EMBODIMENTS

Embodiments of the present invention will be described hereinafter with reference to FIGS. 1–10.

First Embodiment

Figure 1:
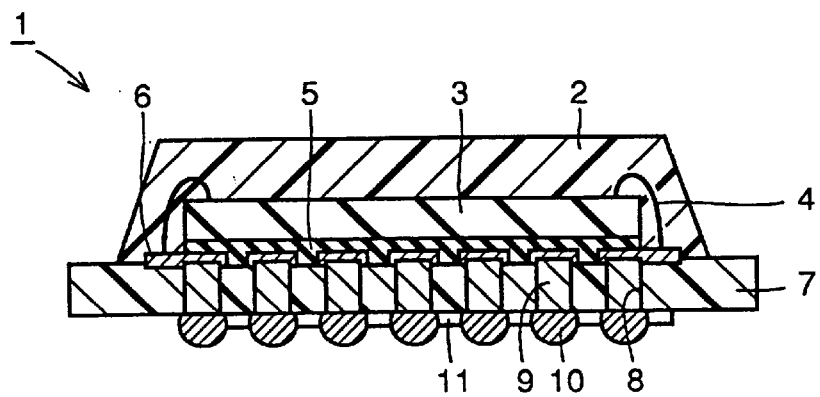
FIG. 1 is a sectional view of a semiconductor device according to a first embodiment of the present invention.
Figure 2:
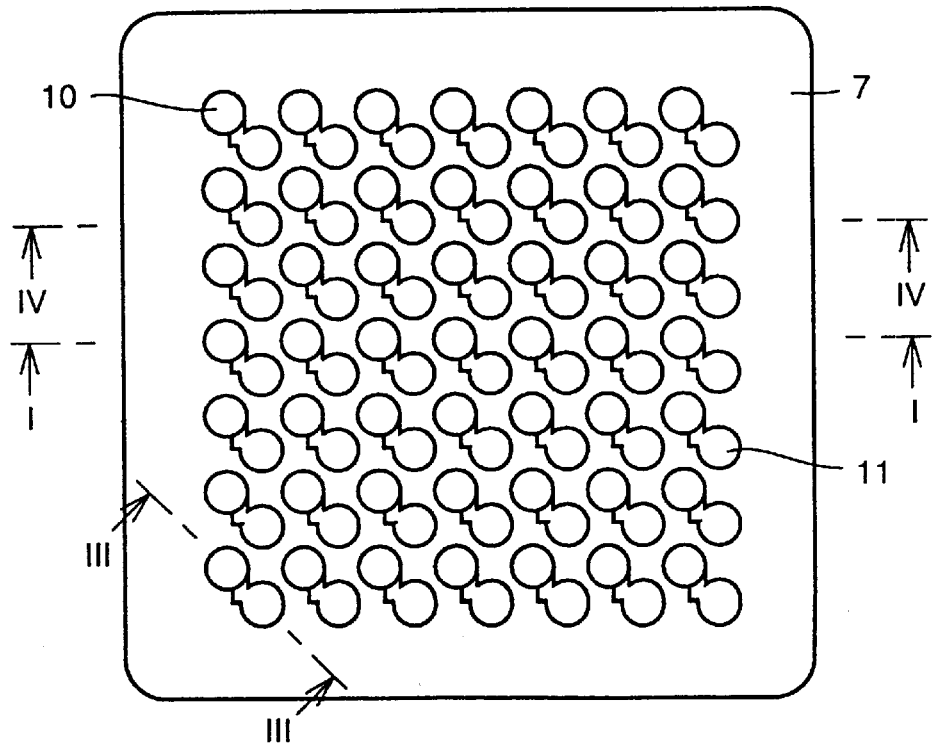
FIG. 2 is a plan view of the semiconductor device of FIG. 1.

FIGS. 1 and 2 are a sectional view and a plan view, respectively, of a BGA type semiconductor device according to a first embodiment of the present invention. The cross sectional structure taken along line I—I of FIG. 2 corresponds to FIG. 1.

Referring to FIG. 1, a BGA type semiconductor device 1 includes a mold resin 2, an LSI chip 3, a wire 4, an adhesive 5, an interconnection layer 6, a substrate 7, an internal conductor 9, a solder ball 10, and a test terminal 11.

LSI chip 3 and interconnection layer 6 are electrically connected via wire 4. Interconnection layer 6 is connected to internal conductor 9, which is connected to solder ball 10. Solder ball 10 functions as an external electrode. Test terminal 11 is formed on the main surface of substrate 7 (on the main surface of BGA type semiconductor device 1), and connected to internal conductor 9 via solder ball 10.

A layered structure of a Cu layer, an Ni layer, and an Au layer can be used as interconnection layer 6. Test terminal 11 is preferably formed of a material identical to that of interconnection layer 6. This provides the advantage that test terminal 11 and interconnection layer 6 can be formed by the same process to suppress increase in the fabrication cost. By forming an Au layer at the surface of test terminal 11, the electrical characteristics can be improved when in contact with the contact pin.

Internal conductor 9 is preferably formed of solder, for example. This ensures the close adherence between internal conductor 9 and solder ball 10. Also, the contact resistance between internal conductor 9 and solder ball 10 can be suppressed to a low level.

Referring to FIG. 2, solder balls 10 are arranged in a matrix at the main surface of BGA type semiconductor device 1. In this case, test terminal 11 is arranged at the center portion of a rectangle region surrounded by four adjacent solder balls 10. This arrangement of test terminal 11 allows the distance between an ambient solder ball 10 and test terminal 11 to be maximum. It is therefore possible to effectively suppress shorting between test terminal 11 and an ambient solder ball 10 even when the distance between solder balls 10 is reduced according to increase in the integration density. Furthermore, distance between a contact pin and an ambient solder ball 10 can be maintained in abutting a contact pin of an IC socket against test terminal 11. Therefore, contact between a contact pin and an ambient solder ball 10 can be suppressed effectively.

Figure 3A:
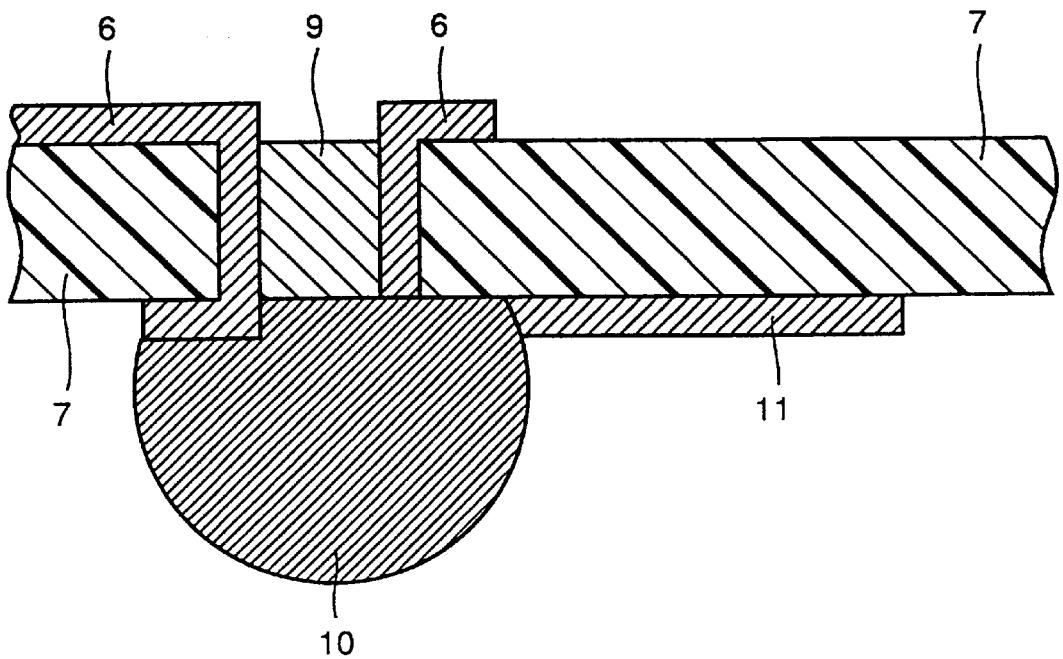
FIGS. 3A and 3B are a sectional view and a plan view, respectively, of a structure in the proximity of a solder ball according to the first embodiment.
Figure 3B:
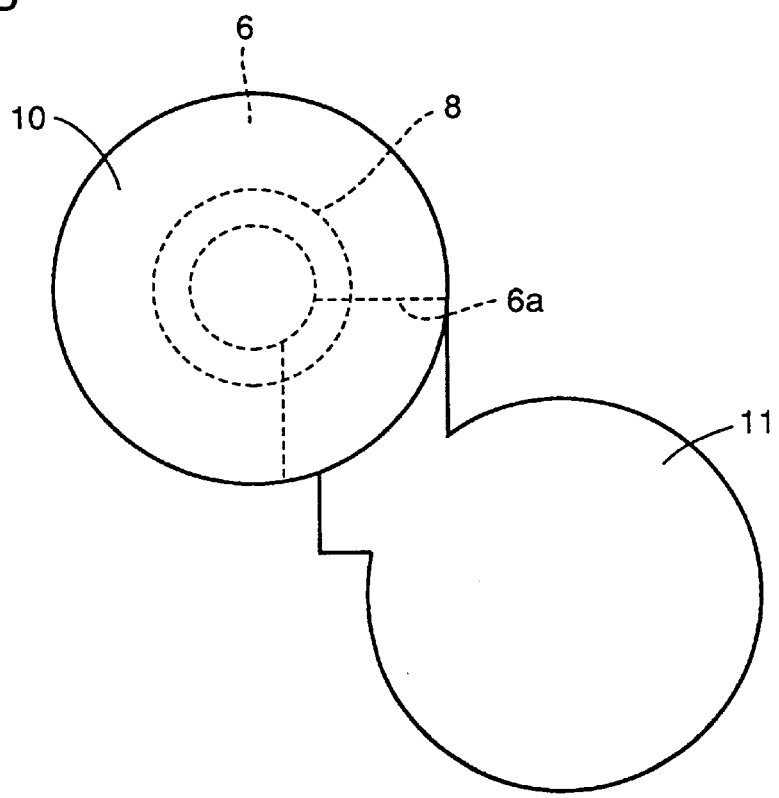

The structure in the proximity of solder ball 10 will be described hereinafter with reference to FIGS. 3A and 3B. FIG. 3A is an enlarged sectional view taken along line III—III of FIG. 2. FIG. 3B is a plan view of the structure of FIG. 3A.

Referring to FIG. 3A, interconnection layer 6 extends right beneath solder ball 10 to the backside of substrate 7 along through hole 8. Internal conductor 9 is formed so as to be surrounded by interconnection layer 6 in through hole 8. Test terminal 11 is formed adjacent to solder ball 10 on the main surface of substrate 7 (the main surface of BGA type semiconductor device 1). More specifically, test terminal 11 is formed so that the side face thereof is brought into contact with the side face of solder ball 10.

Test terminal 11 is formed with a distance from interconnection layer 6. Solder ball 10 extends on internal conductor 9 and on the main surface between interconnection layer 6 and test terminal 11. Accordingly, test terminal 11 can be connected with internal conductor 9 and interconnection layer 6 via solder ball 10. It is therefore possible to reliably identify a defect when, for example, solder ball 10 is missing. Thus, testing of high accuracy can be carried out.

Referring to FIG. 3B, a notch 6a is provided in a portion of interconnection layer 6 extending on the main surface. This presence of notch 6a prevents direct connection between interconnection layer 6 and test terminal 11. Notch 6a can be formed during the patterning process of interconnection layer 6 and test terminal 11. A new fabrication step to form this notch 6a is not required.

According to the structure shown in FIGS. 3A and 3B, connection between solder ball 10 and test terminal 11 is established at the outer circumference of solder ball 10. Test terminal 11 may extend beneath solder ball 10. In this case, care must be exercised to avoid direct connection between interconnection layer 6 and test terminal 11. By providing test terminal 11 so as to extend below solder ball 10, the area of contact between solder ball 10 and test terminal 11 can be increased to reduce the contact resistance between solder ball 10 and test terminal 11.

Figure 4:
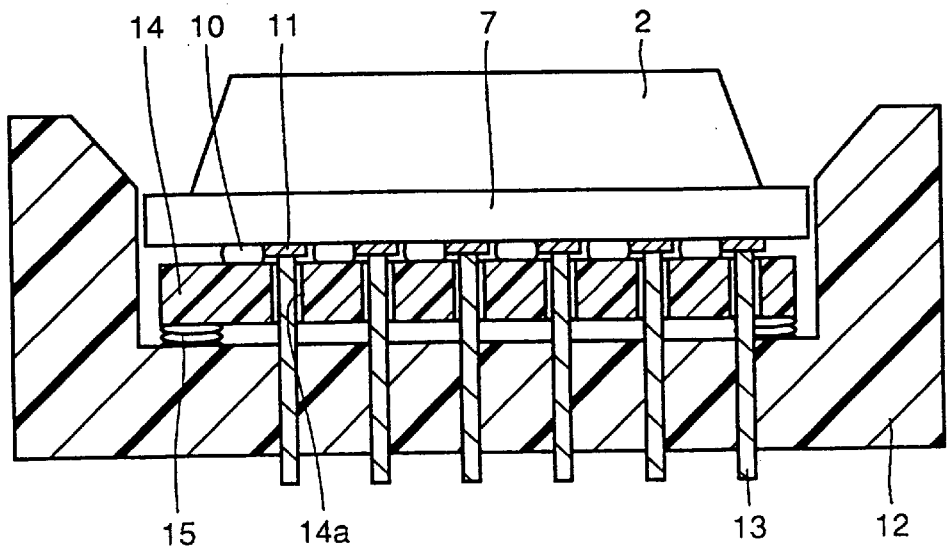
FIGS. 4 and 5 are sectional views of an IC socket for testing the semiconductor device of FIG. 1.
Figure 5:
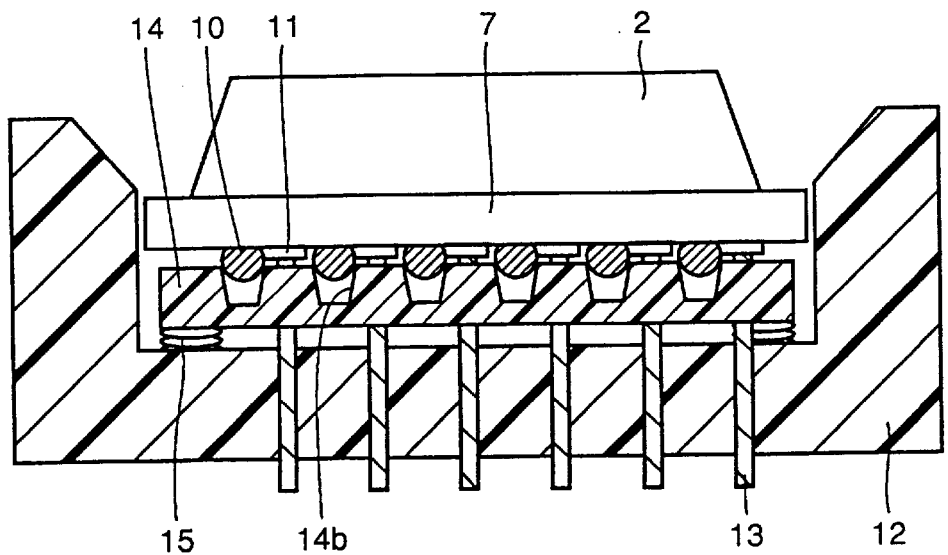

An IC socket for testing the BGA type semiconductor device of FIGS. 1 and 2 will be described hereinafter with reference to FIGS. 4 and 5. FIGS. 4 and 5 are sectional views of an IC socket that can be used for testing BGA type semiconductor device 1 of the first embodiment. FIGS. 4 and 5 are sectional views corresponding to lines IV—IV and I—I, respectively, of FIG. 2.

Referring to FIGS. 4 and 5, an IC socket includes an IC socket main body 12, a contact pin 13, an alignment plate 14, and a spring 15. Alignment plate 14 is formed of, for example, resin, and is supported by spring 15. Alignment plate 14 includes a concave portion 14b for receiving solder ball 10 and a through hole 14a for receiving contact pin 13.

In carrying out a test using an IC socket of the above-described structure, BGA type semiconductor device 1 is mounted on alignment plate 14 with the side where solder balls 10 are arranged downward. Here, solder ball 10 is arranged within concave portion 14b, and alignment between test terminal 11 and contact pin 13 is carried out using the external circumferential side face of solder ball 10 as shown in FIG. 5.

For the purpose of alignment between test terminal 11 and contact pin 13 using the external circumferential side face of solder ball 10, the relationship of position between through hole 14a and concave portion 14b is adjusted appropriately. Also, concave portion 14b is formed as set forth in the following. Concave portion 14b includes a sidewall supporting the circumferential side face of solder ball 10, and a bottom face spaced apart from the bottom of solder ball 10 (the surface of solder ball 10 of the side more remote from the main surface) while abutment is achieved between the sidewall and the external circumferential side face of solder ball 10. This structure of concave portion 14b prevents contact between concave portion 14b and the bottom of solder ball 10. It is therefore possible to suppress the deformation of solder ball 10 to a range of a negligible level.

Following positioning between test terminal 11 and contact pin 13 using the circumferential side face of solder ball 10, contact pin 13 is abutted against test terminal 11 via through hole 14a shown in FIG. 4. Thus, testing prior to mounting can be carried out. Through hole 14a also functions as a guide for abutting contact pin 13 against test terminal 11. A desired face at the leading end of contact pin 13 can be reliably brought into contact with test terminal 11. Thus, appropriate testing can be carried out.

As shown in FIGS. 4 and 5, concave portion 14b and through hole 14a are provided with a distance therebetween. This prevents contact between contact pin 13 and solder ball 10 in abutting contact pin 13 against test terminal 11. This contributes to solving the problem of deformation of solder ball 10 and adherence of solder scraps onto contact pin 13.

Second Embodiment

Figure 6:
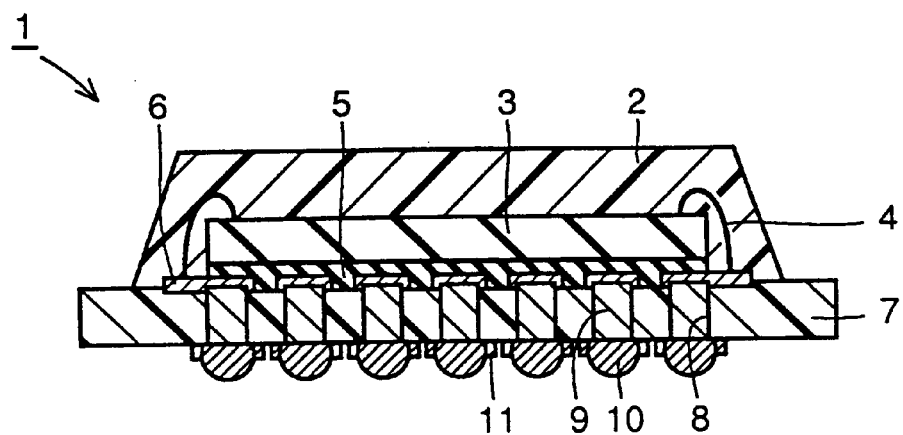
FIG. 6 is a sectional view showing a semiconductor device according to a second embodiment of the present invention.

A BGA type semiconductor device 1 and an IC socket according to a second embodiment of the present invention will be described hereinafter with reference to FIGS. 6–8. FIG. 6 is a sectional view of a BGA type semiconductor device 1 according to the second embodiment, taken along line VI—VI of FIG. 7 which is a plan view thereof.

Figure 7:
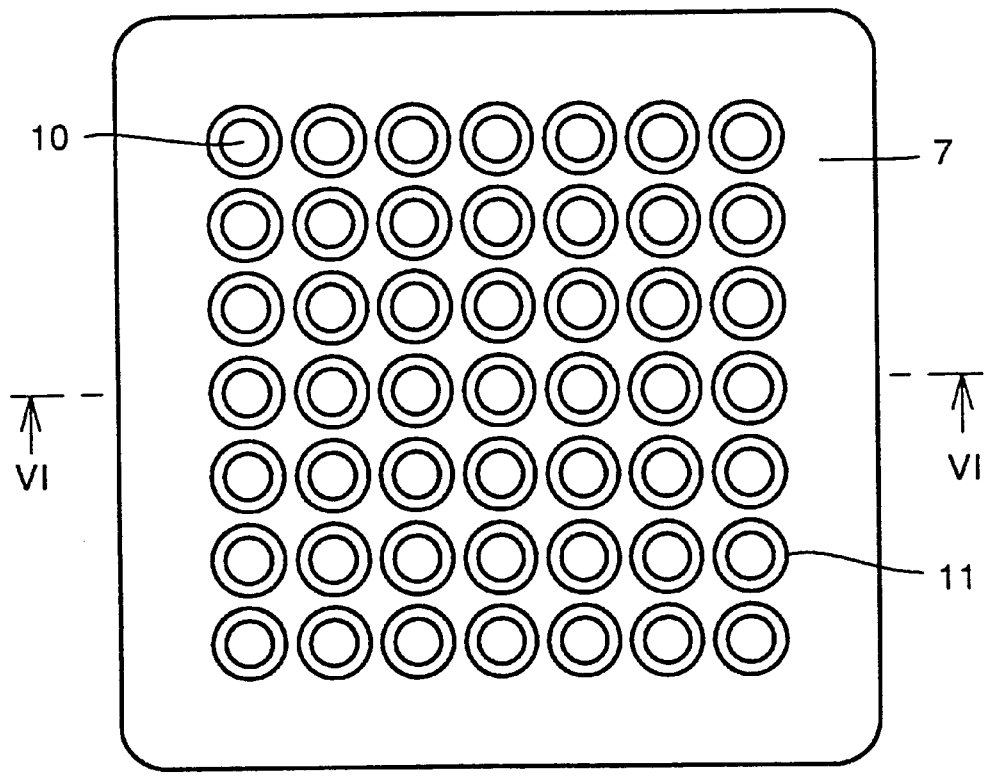
FIG. 7 is a plan view of the semiconductor device of FIG. 6.

As shown in FIGS. 6 and 7, a test terminal 11 is formed so as to surround solder ball 10. More specifically, the circle defining the circumference of solder ball 10 is concentric with the circle defining the circumference of test terminal 11. The remaining structure is similar to that of BGA type semiconductor device 1 shown in FIGS. 1 and 2.

Figure 8:
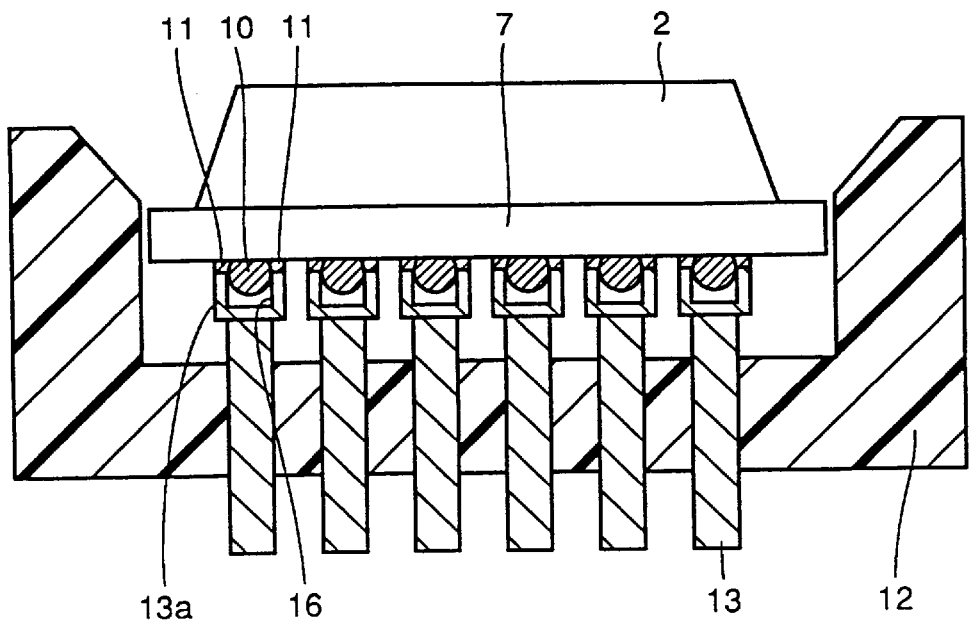
FIG. 8 is a sectional view showing an IC socket for testing the semiconductor device of FIG. 6.

An IC socket as shown in FIG. 8 can be used in testing a BGA type semiconductor device 1 having the above-described structure. Referring to FIG. 8, an IC socket includes an IC socket main body 12, and a contact pin 13. Contact pin 13 includes a leading end 13a where a concave portion 16 is formed.

Solder ball 10 is just inserted in concave portion 16 at the leading end of contact pin 13 in testing BGA type semiconductor device 1 of the second embodiment using an IC socket of the above-described structure. Accordingly, alignment between contact pin 13 and test terminal 11 can be effected using the outer circumferential side face of solder ball 10. Also, contact pin 13 can be abutted against test terminal 11.

Here, abutment between the bottom of concave portion 16 and the bottom of solder ball 10 is avoided. Therefore, contact between the bottom of solder ball 10 and contact pin 13 can be prevented. It is therefore possible to suppress deformation of solder ball 10.

By providing test terminal 11 so as to surround solder ball 10, the inner circumferential face of concave portion 16 can be made to abut against the circumferential face of solder ball 10 in providing abutment between test terminal 11 and the leading end of contact pin 13. The area of contact with contact pin 13 can be increased to allow appropriate electrical contact.

Third Embodiment

An IC socket according to a third embodiment of the present invention will be described with reference to FIGS. 9 and 10.

Figure 9:
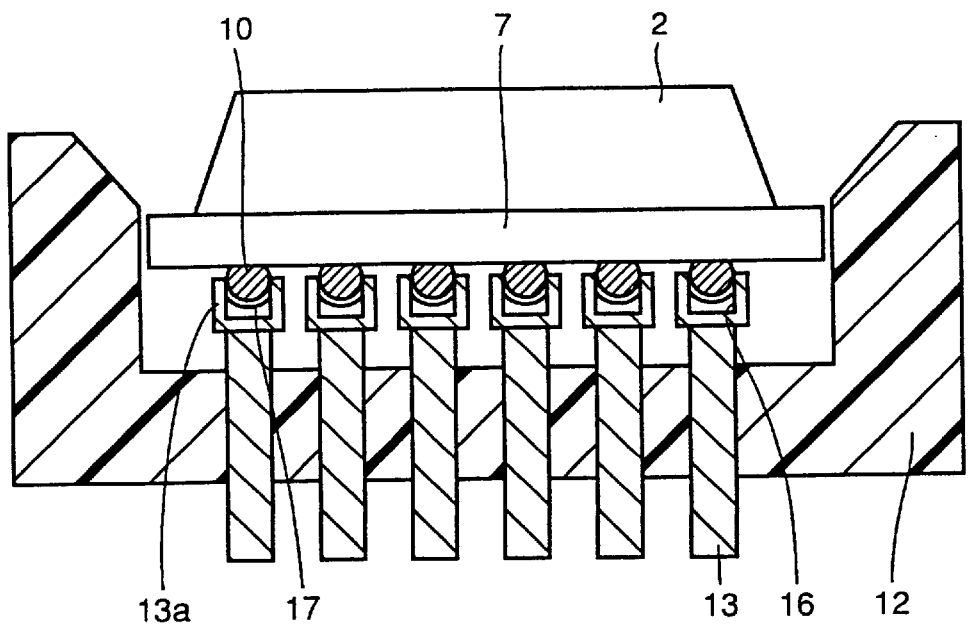
FIG. 9 is a sectional view showing an IC socket according to a third embodiment of the present invention.

Referring to FIG. 9, the IC socket of the third embodiment has a net wire 17 provided at the leading end of contact pin 13. Electrical connection between solder ball 10 and contact pin 13 is established by abutting net wire 13 against solder ball 10 to allow testing prior to mounting. The remaining structure is substantially similar to that of the IC socket shown in FIG. 8.

Net wire 17 of the third embodiment will be described in detail with reference to FIG. 10. Net wire 17 is formed of a material identical to contact pin 13, for example, and is elastic. It is therefore possible to effectively suppress deformation of solder ball 10 when abutment between net wire 17 and solder ball 10 is effected.

The usage of net wire 17 ensures a sufficient contact area between solder ball 10 and net wire 17 even when the surface of solder ball 10 is irregular. This arises from the fact that there is a gap between the wires forming net wire 17, and that net wire 17 can easily be deformed according to the surface configuration of solder ball 10 even if the surface of solder ball 10 is irregular.

By using net wire 17, solder scraps can drop through the gaps of the wires forming the net wire. Therefore, solder scraps are less liable to adhere to net wire 17.

The conventional problem caused by adherence of solder scraps can be eliminated.

Figure 10:
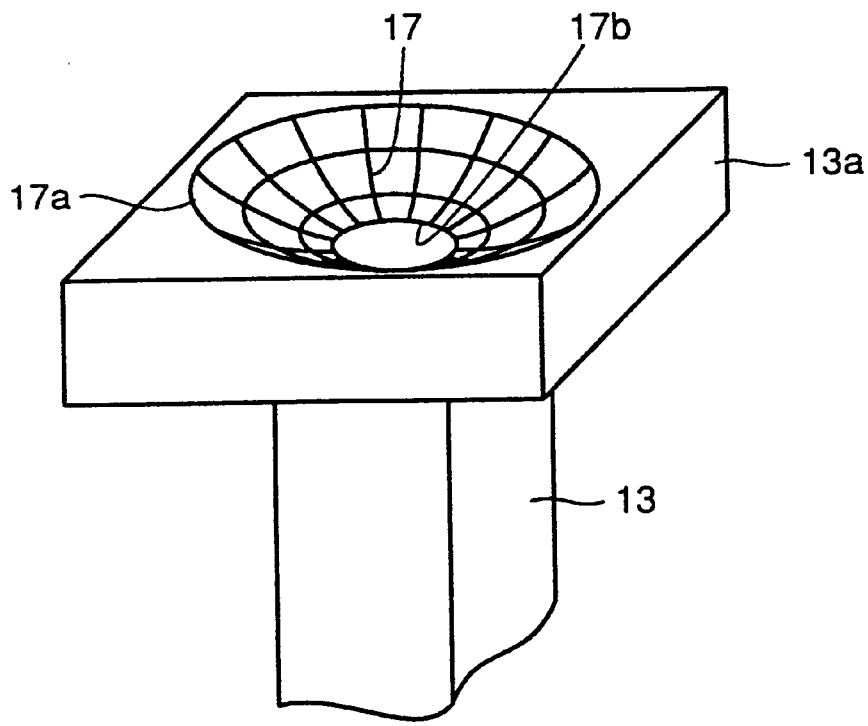
FIG. 10 is a perspective view of a leading end portion of a contact pin in the IC socket of FIG. 9.
Figure 11:
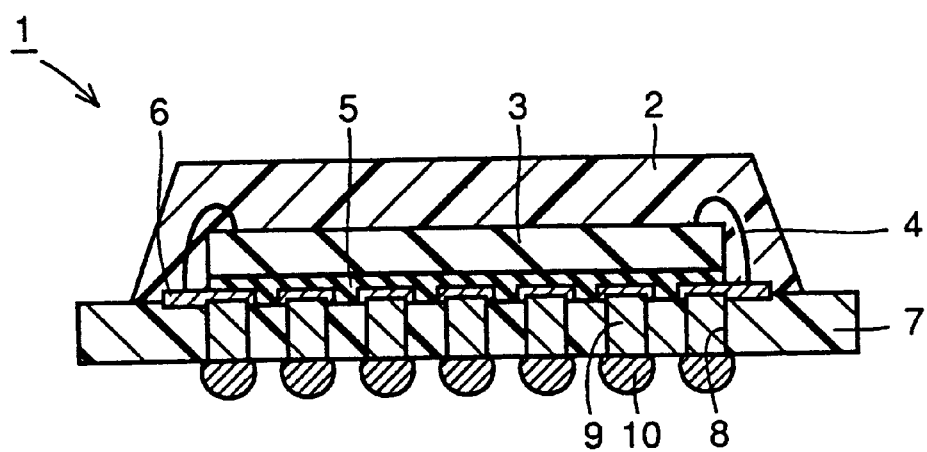
FIG. 11 is a sectional view showing an example of a conventional semiconductor device.
Figure 12:
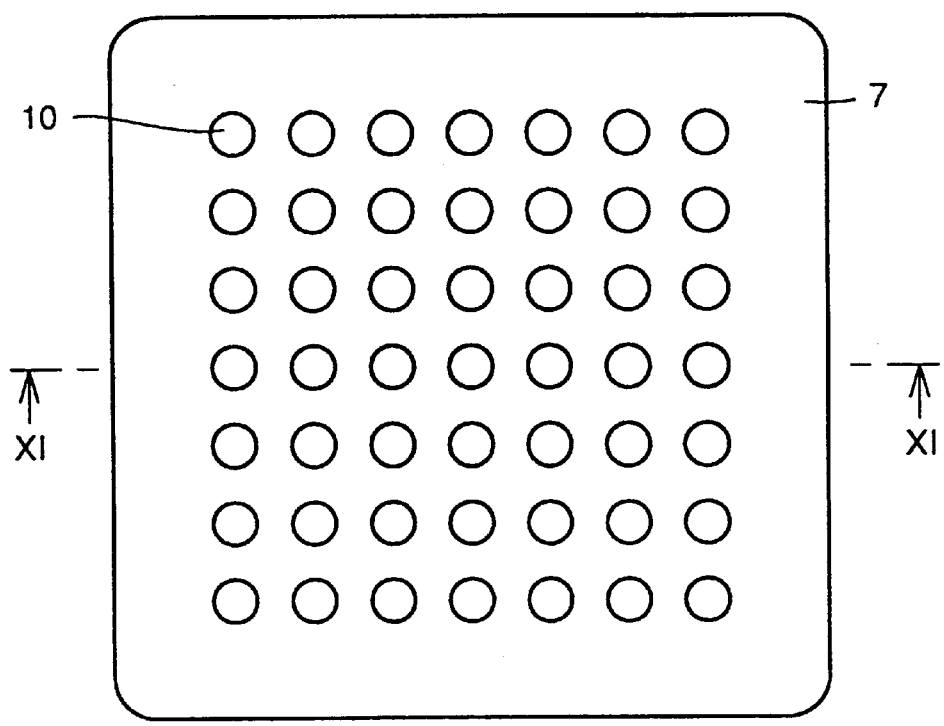
FIG. 12 is a plan view of the semiconductor device of FIG. 11.
Figure 13:
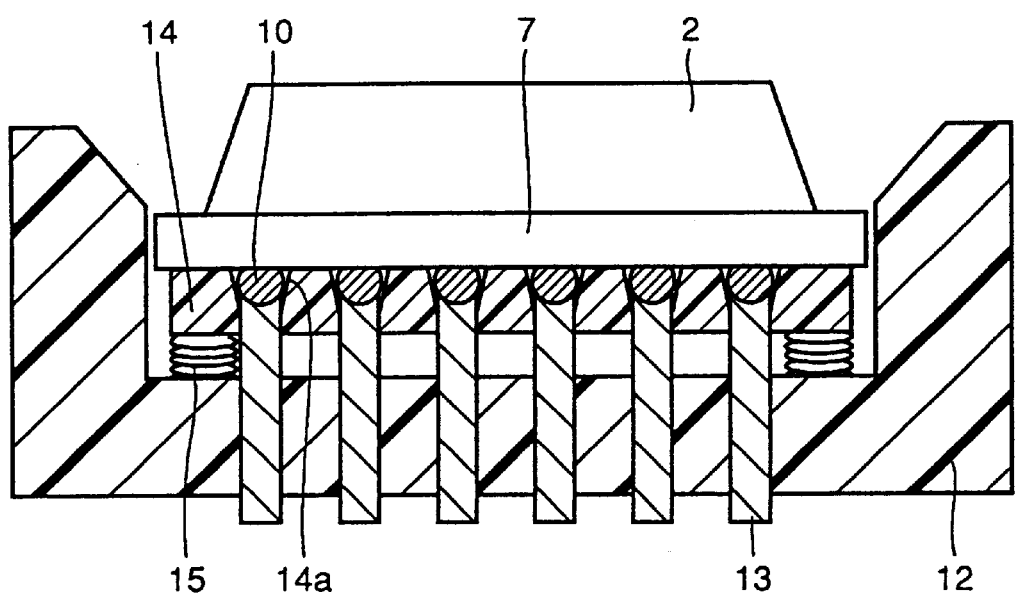
FIG. 13 is a sectional view showing an example of an IC socket for testing the semiconductor device of FIG. 11.

As shown in FIG. 10, net wire 17 has an annular upper portion 17a defining an upper opening, and an annular lower portion 17b defining a lower opening. The diameter of the upper opening is set greater than the diameter of the lower opening. Therefore, net wire 17 has a configuration widened upwards to facilitate receptance of solder ball 10 through the upper opening. It is also possible to apply a positioning function for contact pin 13 with respect to solder ball 10.

The lower opening serves to prevent contact between net wire 17 and the bottom of solder ball 10. By this lower opening, damage of the bottom of solder ball 10 can be prevented.

As shown in FIG. 10, upper portion 17a is preferably connected to leading end 13a along the entire circumference. This ensures the resistance of net wire 17. Upper portion 17a of net wire 17 can be engaged with leading end 13a or welded to leading end 13a.

Furthermore, net wire 17 extends into convex portion 16 as shown in FIG. 10. Lower portion 17b is free within convex portion 16. This becomes a factor for the tolerance of deformation of net wire 17 when abutment between net wire 17 and solder ball 10 is established. Also, the load generated when net wire 17 is urged against solder ball 10 can be effectively distributed over wire 17 to contribute to suppress deformation of solder ball 10.

Although the above embodiments have been described in which the present invention is applied to a BGA type semiconductor device, the present invention is applicable to any semiconductor device having a plurality of protruding external electrodes arranged at the main surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device with a test terminal including a plurality of protruding external electrodes arranged on a main surface, said semiconductor device comprising:

an internal conductor connected to said external electrode, said test terminal being formed on said main surface adjacent to said external electrode, and said external electrode connecting said internal conductor to said test terminal.

2. The semiconductor device with a test terminal according to claim 1, wherein said test terminal is arranged spaced apart from said internal conductor, and said external electrode extends on said internal conductor and on a side face of said test terminal.

3. The semiconductor device with a test terminal according to claim 1, wherein said external electrode is arranged in a matrix, and said test terminal is arranged at the center of a region surrounded by at least three adjacent external electrodes.

4. The semiconductor device with a test terminal according to claim 1, wherein said test terminal is formed so as to surround said external electrode.

5. An IC socket for testing a semiconductor device with a test terminal including a plurality of protruding external electrodes arranged on a main surface, said IC socket comprising:

a contact pin abutted against said test terminal for said testing, and an alignment mechanism for positioning said contact pin and said test terminal using a circumferential side face of said external electrode.

6. The IC socket according to claim 5, wherein said alignment mechanism comprises an alignment member attached to a main body of the IC socket, said alignment member includes a concave portion receiving said external electrode, and a through hole formed with a distance from said concave portion for receiving said contact pin, said contact pin is abutted against said test terminal while avoiding contact between said contact pin and said external electrode by inserting said contact pin in said through hole in a state where said external electrode is accommodated in said concave portion.

7. The IC socket according to claim 5, wherein said alignment mechanism comprises a concave portion provided at a leading end of said contact pin for receiving said external electrode, and the leading end of said contact pin is abutted against said test terminal in a state where said external electrode is accommodated in said concave portion.

8. The IC socket according to claim 6, wherein said concave portion has a bottom located apart from a bottom of said external electrode in a state where said external electrode is accommodated in said concave portion.

9. An IC socket for testing a semiconductor device including a plurality of protruding external electrodes arranged on a main surface, said IC socket comprising:

a contact pin having a concave portion at a leading end for carrying out said testing by being electrically connected with said external electrode, and a net wire attached at a leading end portion of said contact pin defining said concave portion, and abutted against a circumferential side face of said external electrode excluding a bottom thereof, and said net wire having an upper opening for receiving said external electrode, and having an upper end portion defining said upper opening and being connected to the leading end portion of said contact pin along the entire circumference.

10. The IC socket according to claim 9, wherein said net wire includes a lower opening extending within said concave portion for avoiding contact between a bottom of said external electrode and said net wire by receiving said bottom of said external electrode, wherein said upper opening has a width greater than the width of said lower opening.

* * * * *